United States Patent
Hosokawa

(10) Patent No.: US 8,664,599 B2
(45) Date of Patent: Mar. 4, 2014

(54) ELECTRON MICROSCOPE

(75) Inventor: Fumio Hosokawa, Tokyo (JP)

(73) Assignee: JEOL Ltd., Tokyo (JP)

( * ) Notice: Subject to any disclaimer, the term of this patent is extended or adjusted under 35 U.S.C. 154(b) by 285 days.

(21) Appl. No.: 12/711,467

(22) Filed: Feb. 24, 2010

(65) Prior Publication Data
US 2010/0224781 A1    Sep. 9, 2010

(30) Foreign Application Priority Data
Mar. 3, 2009   (JP) ................................ 2009-049253

(51) Int. Cl.
*G01N 23/00*    (2006.01)

(52) U.S. Cl.
USPC ........ 250/311; 250/306; 250/310; 250/396 R; 250/396 ML

(58) Field of Classification Search
USPC ............. 250/306, 307, 309, 310, 311, 396 R, 250/397, 398, 396 ML
See application file for complete search history.

(56) References Cited

U.S. PATENT DOCUMENTS

| 4,694,178 A * | 9/1987 | Harte ........................ 250/396 R |
| 7,420,179 B2 | 9/2008 | Hosokawa |
| 2007/0158567 A1 | 7/2007 | Nakamura et al. |
| 2009/0256081 A1 * | 10/2009 | Kaga ........................ 250/396 R |

FOREIGN PATENT DOCUMENTS

| JP | 2007-95335 A | 4/2007 |
| JP | 2007-173132 A | 7/2007 |

\* cited by examiner

*Primary Examiner* — Robert Kim
*Assistant Examiner* — Hanway Chang
(74) *Attorney, Agent, or Firm* — The Webb Law Firm

(57) ABSTRACT

An electron microscope is offered which facilitates aberration correction even during high-magnification imaging. The microscope has a spherical aberration corrector, a transfer lens system mounted between the corrector and an objective lens, an aperture stop mounted in a stage preceding the corrector so as to be movable relative to the optical axis, and an angular aperture stop mounted at or near the principal plane of the transfer lens system movably relative to the optical axis to adjust the angular aperture of the electron beam.

3 Claims, 4 Drawing Sheets

ELECTRON MICROSCOPE

BACKGROUND OF THE INVENTION

1. Field of the Invention

A prior art scanning transmission electron microscope has aperture stops to control the emission current and illumination angle of the electron beam relative to a specimen. The aperture stops are movably mounted near the principal plane of a condenser lens (brightness-adjusting lens) immediately behind the electron source. Usually, plural aperture stops having different hole diameters are used for the above-described control operations. The aperture stops are mounted to a stop holder having a moving mechanism. Because the aperture stops are close to the principal plane of the condenser lens, if the strength of the condenser lens is varied while one aperture stop is in operation, the total amount of current impinging on the specimen does not vary so much.

2. Description of Related Art

In the case of an electron microscope employing no aberration correction technique, the necessity to controllably vary the angular aperture of the electron beam in increments of a few mrad is low because no aberration correction is made. Accordingly, it is customary to prepare aperture stops having hole diameters which are roughly doubled successively, such as 20, 40, 70, 100, and 200 μm.

A conventional scanning transmission electron microscope utilizing an aberration correction technique is disclosed in JP-A-2007-173132. In this known microscope, an electron source, a condenser lens, condenser apertures (aperture stops), a spherical aberration corrector, a deflector, a transfer lens, and an objective lens are arranged in this order from the upstream side. Also, in this case, there are condenser apertures having different hole diameters. An electron beam is made to pass through a selected one of these apertures, thus varying the angular aperture. Which of the aperture stops is selected depends on the balance between the spherical aberration and diffraction aberration at a desired magnification. Then, the beam is suppressed in spherical aberration by an aberration corrector and made to impinge on the specimen.

Another scanning transmission electron microscope utilizing an aberration correction technique is disclosed in JP-A-2007-95335. In this known instrument, two transfer lens subassemblies giving a magnification M of 1 or more are disposed between a spherical aberration corrector and an objective lens. The spherical aberration corrector produces a negative spherical aberration that cancels out the positive spherical aberration of the objective lens. However, third-order star aberration $S_3$ and third-order four-fold astigmatism $A_3$ which occur concomitantly can no longer be neglected. Accordingly, in the technique of JPA-2007-95335, the spherical aberration appearing on the specimen is canceled out and the effects of the third-order star aberration $S_3$ and third-order four-fold astigmatism $A_3$ are reduced by adjusting the bore diameter of the spherical aberration corrector and setting the magnification M of the transfer lens subassemblies to 1 or more.

In order to achieve aberration correction during high magnification imaging, it is necessary to set the aperture value appropriately for the residual aberrations. That is, the angular aperture of the electron beam needs to be adjusted in small increments, e.g., the semi-angular aperture is varied in increments of 2 mrad about the angle of 30 mrad. Therefore, with aperture stops differing greatly in hole diameter as described previously, it is difficult to adjust the angular aperture minutely. Furthermore, the present situation in conventional scanning transmission electron microscopes equipped with an aberration corrector is that the angular aperture is varied by selecting one aperture stop and adjusting the strength of each lens without varying the selected aperture stop. Therefore, where the angular aperture is adjusted minutely by adjusting the strength of each lens, correction conditions for the aberrations are also required to be readjusted. This complicates the adjustment of the whole electron optical system.

SUMMARY OF THE INVENTION

It is an object of the present invention to provide an electron microscope permitting aberrations to be corrected easily even during high magnification imaging.

One embodiment of the present invention provides an electron microscope having a spherical aberration corrector, a transfer lens system mounted between the spherical aberration corrector and an objective lens, an aperture stop mounted in a stage preceding the spherical aberration corrector movably relative to the optical axis, and an angular aperture stop mounted at or near the principal plane of the transfer lens system movably relative to the optical axis to adjust the angular aperture of the electron beam.

Preferably, the transfer lens system consists of a pair of axisymmetric lenses. The transfer lens system gives a magnification of 1 or more.

Preferably, the angular aperture stop is mounted between the principal plane of the rear one of the axisymmetric lenses and the front focal plane of the objective lens.

Preferably, the angular aperture stop has holes of different diameters.

Preferably, the hole diameters of the angular aperture stop are 50 μm or more.

After correction of the spherical aberration with the spherical aberration corrector, the angular aperture of the electron beam is adjusted finely without modifying the hole diameters of the aperture stop. The residual aberrations on the specimen can be suppressed. Consequently, the adjustment time can be shortened during high-magnification and high-resolution imaging.

Other objects and features of the invention will appear in the course of the description thereof, which follows.

DESCRIPTION OF THE PREFERRED EMBODIMENTS

The preferred embodiments of the present invention are hereinafter described with reference to the drawings. In the following description, a scanning transmission electron microscope (STEM) is taken as one example of the used electron microscope. The present invention can also be applied to transmission electron microscopes (TEMs) and scanning electron microscopes (SEMs).

Figure 1:
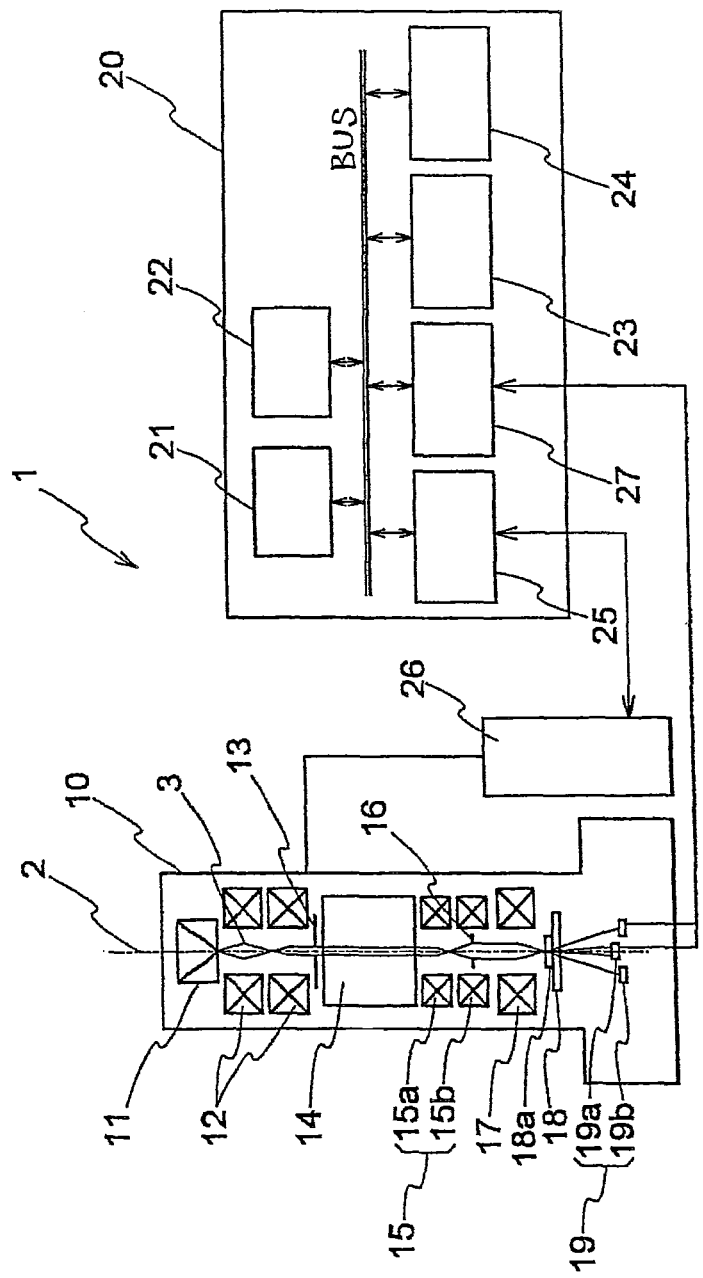
FIG. 1 is a schematic diagram of a scanning transmission electron microscope associated with one embodiment of the present invention.
Figure 2:
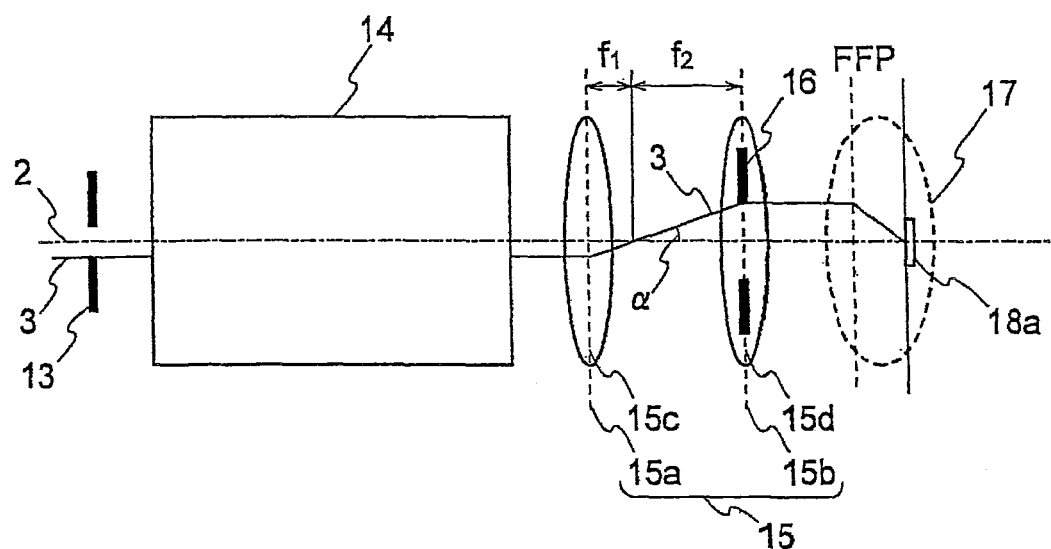
FIG. 2 is a schematic diagram showing the arrangement of an angular aperture stop associated with one embodiment of the present invention.

FIG. 1 is a schematic diagram showing a scanning transmission electron microscope associated with one embodiment of the present invention, the microscope being indicated by reference numeral 1. FIG. 2 is a schematic diagram showing the arrangement of an angular aperture stop associated with one embodiment of the invention.

The scanning transmission electron microscope 1 is chiefly comprised of a microscope body 10 and a control unit 20 for controlling an electron optical system installed in the body 10. An electron gun 11 for emitting an electron beam 3 is installed within the electron optical column of the microscope body 10. Arranged downstream from the electron gun 11 are at least one condenser lens 12, an aperture stop 13, a spherical aberration corrector 14, a transfer lens system 15, an angular aperture stop 16, an objective lens 17, a specimen holder 18 on which a specimen 18a is held, and a detector assembly 19. The transfer lens system 15 is composed of a first transfer lens 15a and a second transfer lens 15b located along the optical axis 2, the second lens being downstream of the first lens. Sometimes, the condenser lenses 12 are plural in number. Because the energy of the electron beam 3 passing through the microscope 1 is generally high, it is desired that each of the lenses be a magnetic lens. However, if the withstand voltage of the insulation permits, each may be an electrostatic lens.

The electron gun 11, condenser lens 12, spherical aberration corrector 14, transfer lens system 15, objective lens 17, and detector assembly 19 are controlled via a power supply portion 26 by the control unit 20 including a power supply control portion 25. The detector assembly 19 is composed of a bright field detector 19a and a dark field detector 19b and delivers a detection signal to the signal-processing portion 27 of the control unit 20.

The control unit 20 includes a CPU (central processing unit) 21 forming a computer, storage device 22, such as a memory and a hard disk, an input portion 23 forming an interface with the user and including a mouse and a keyboard, a display portion 24 for displaying a microscope image and setting values for the electron optical system, the power supply control portion 25 for controlling the voltage applied to the condenser lens 12 of the electron optical system or excitation currents flowing through the system, and a signal-processing portion 27 for processing the detection signal from the detector assembly 19. The CPU 21 runs a program loaded in the storage device 22 and controls the input portion 23, display portion 24, power supply control portion 25, and signal-processing portion 27 based on the executed program. The power supply portion 26 applies voltages or currents to the electron optical system based on a control signal from the power supply control portion 25.

The operation of the scanning transmission electron microscope 1 is now described. The electron gun 11 produces the electron beam 3 while applied with a high voltage from the power supply portion 26. The produced beam 3 is accelerated and converged by the condenser lens 12.

The aperture stop 13 has plural holes differing in diameter, and stipulates the diameter of the electron beam 3. For instance, the diameters of the holes in the aperture stop 13 are 20 m, 40 μm, 70 μm, 100 μm, and 200 μm, respectively. Consequently, the total amount of current of the beam 3 impinging on the specimen held on the specimen holder 18 is controlled. Also, the angular aperture of the beam hitting the next stage, i.e., the spherical aberration corrector 14, is restricted. The aperture stop 13 is mounted, for example, on an X-Y motion stage (not shown) and moves within a plane perpendicular to the optical axis 2. The stop 13 is preferably located in the principal plane of the condenser lens 12 but the preferred location is not limited to this.

The electron beam 3 passed through the aperture stop 13 is substantially collimated and enters the spherical aberration corrector 14. The corrector 14 corrects the spherical aberration in the electron beam 3. In particular, the corrector produces a negative spherical aberration with respect to the beam 3, thus suppressing the positive spherical aberration in the beam 3 induced on the specimen 18a by the objective lens 17.

Figure 3:
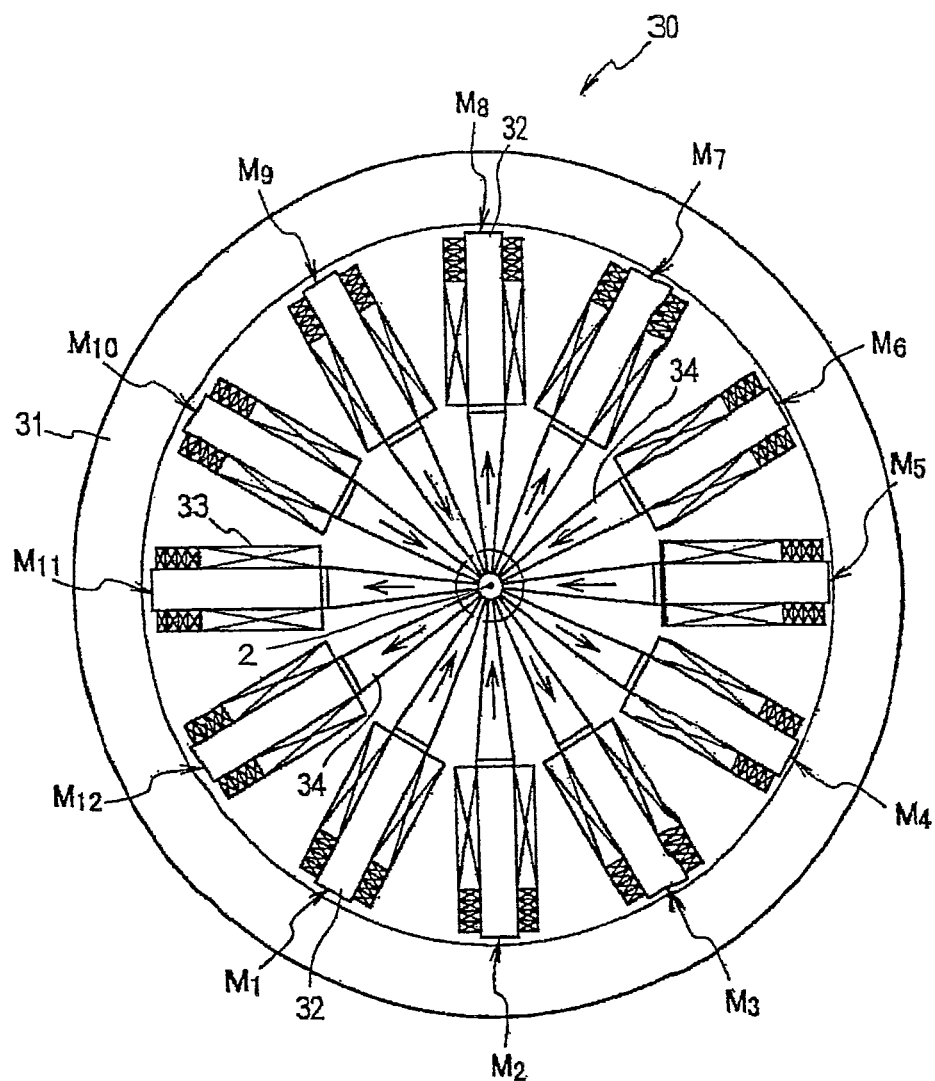
FIG. 3 is a schematic diagram of magnetic dodecapoles incorporated in a spherical aberration corrector associated with one embodiment of the present invention.

The spherical aberration corrector 14 may be of the known structure. For example, the magnetic dodecapoles disclosed in JP-A-2007-95335 can be used to fabricate the corrector 14. In particular, as shown in FIG. 3, two stages of magnetic dodecapoles are disposed on the optical axis 2. Each multipole element produces two 3-fold symmetric magnetic fields which are analogous in strength distribution about the optical axis 2 but opposite in sense. FIG. 3 shows examples of the magnetic dodecapoles 30. Twelve magnetic poles $M_1$, $M_2$, ..., $M_{12}$ are circumferentially spaced from each other along the inner surface of an outer annular yoke 31 and arranged about the optical axis 2. Each magnetic pole has a core 32. A polar element 34 is mounted on the side of the core 32 facing the optical axis 2. An arrow attached to each polar element 34 indicates the sense of the magnetic field. In the magnetic dodecapoles 30 shown in FIG. 3, an exciting coil 33 is wound around each core 32 of the magnetic poles $M_1$, $M_2$, $M_5$, $M_6$, $M_9$, and $M_{10}$ to produce a magnetic field facing the optical axis 2. Similarly, another exciting coil 33 is wound around each core 32 of the magnetic poles $M_3$, $M_4$, $M_7$, $M_8$, $M_{11}$, and $M_{12}$ to produce a magnetic field of the opposite sense.

The spherical aberration corrector 14 produces the negative spherical aberration owing to the above-described magnetic field distribution. Combination of this negative spherical aberration with the positive spherical aberration produced by the rear stage of objective lens cancels out the spherical aberration at the specimen. Instead of the magnetic dodecapoles, magnetic hexapoles may be used. Furthermore, electric dodecapoles or hexapoles or combined electric-magnetic dodecapoles or hexapoles may be used.

The electron beam 3 passed through the spherical aberration corrector 14 enters the transfer lens system 15. Fundamentally, the transfer lens system 15 is an optical system that transfers the electron beam 3 such that the principal plane of the final stage of lens (not shown) of the spherical aberration corrector 14 is conjugate with the front focal plane FFP of the objective lens 17.

As described previously, the transfer lens system 15 is composed of the two axisymmetric lenses. Alternatively, the transfer lens system 15 may be made of a single axisymmetric lens. In any case, the magnification of the transfer lens system can be set to any arbitrary value. Setting the magnification to 1 or more as described later is advantageous in removing the residual aberrations. One example of lens system having such a magnification is a transfer optical system disclosed, for example, in JP-A-2007-95335. That is, the focal point of the first transfer lens 15a on the image point side is made coincident with the focal point of the second transfer lens 15b on the object point side. The focal distance $f_2$ of the second transfer lens 15b on the object point side is equal to or greater than the focal distance $f_1$ of the first transfer lens 15a on the image point side. Therefore, the magnification M of the transfer lens system 15 is $f_2/f_1$, which is 1 or more. This means that the radius of the electron beam 3 emerging from the lens system is enlarged as compared on incidence.

The effect of the magnification M is also set forth in JP-A-2007-95335. That is, let $X_0$ be the contribution of the nth-order aberration produced in the spherical aberration corrector 14 to the aberration coefficient of the objective lens 17 and let C be the aberration coefficient of the spherical aberration corrector 14. The contribution is given by $$X_0 = (1/M)^{n+1} C$$

That is, as the magnification M is increased, the contribution of the aberration produced in the spherical aberration corrector 14 on the specimen decreases accordingly. Therefore, the contributions of the other aberrations are suppressed while the spherical aberration of the objective lens 17 is canceled out by reducing the bore radius of the magnetic dodecapoles and increasing the excitation current as described in JP-A-2007-95335.

Meanwhile, the electron beam 3 that has been corrected for aberrations by the spherical aberration corrector 14 has been passed through the aperture stop 13. In other words, the corrector 14 corrects the beam for spherical aberration, the beam having a diameter and an angular aperture stipulated by the aperture stop 13. Accordingly, where an optimum value of the angular aperture a of the beam 3 for the spherical aberration corrector 14 is searched for, the radii of the holes in the aperture stop 13 must be modified. However, the settings of the lenses and corrector 14 lying between the electron gun 11 and the specimen 18a depend on the position of the selected hole in the aperture stop 13. If the hole diameter of the aperture stop 13 is modified, then it follows that the aberration correction conditions for the spherical aberration corrector 14 are readjusted, as well as the previously determined settings of the various lenses including the upstream condenser lens 12. Such readjustments are very cumbersome to perform and will lead to increase in the adjustment time and eventually to elongation of the observation time.

Figure 4:
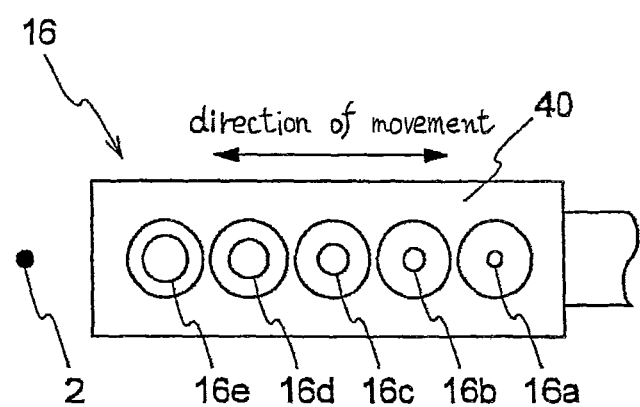
FIG. 4 is a schematic diagram of an angular aperture stop associated with one embodiment of the present invention.

Accordingly, in the present invention, the angular aperture stop 16 is mounted between the transfer lens system 15 and the objective lens 17. The stop 16 is used to finely adjust the angular aperture a of the electron beam 3 passed through the spherical aberration corrector 14 in increments of about 2 mrad. As an example, the angular aperture stop 16 has plural holes 16a-16e having diameters of 50 μm, 60 μm, 70 μm, 80 μm, and 90 μm, respectively, as shown in FIG. 4. The holes 16a-16e are formed within the same plane in a holder 40, which, in turn, is held to a moving mechanism (not shown) capable of moving the holder 40 within a plane perpendicular to the optical axis 2. The holes having the different diameters may be offered by an apertured product as shown in FIG. 4 or may be formed in a single metal plate.

As the diameter of a hole in the aperture stop is increased, the hole can be machined with better accuracy. That is, where holes of larger diameters are fabricated, less deviations occur from their desired values. This is advantageous in terms of cost. Therefore, to permit the angular aperture a to be adjusted accurately, it is desired to place the holes 16a-16e in locations where the diameter of the electron beam is maximized. Such preferred locations are in a region extending from a principal plane 15d of the second transfer lens 15b to the front focal plane FFP of the objective lens 17. Note that if the holes are placed at or near a principal plane 15c of the first transfer lens 15a, the angular aperture can be adjusted finely. In this case, the diameters of the holes are set according to the maximum diameter of the beam, which, in turn, depends on the angular aperture a and on the focal distance $f_1$ of the first transfer lens 15a. Sometimes, it is difficult to place the angular aperture stop 16 at the principal planes 15c and 15d depending on the shapes of the first and second transfer lenses 15a and 15b. In these cases, the holes may be formed in the opening portion in the polepieces (not shown) forming the first transfer lens 15a or second transfer lens 15b. The opening portion is close to the principal plane 15c or 15d and so the diameter of the electron beam 3 hardly varies. Consequently, it can be said that the angular aperture stop 16 does not adversely affect the correction of the residual aberrations.

Since the angular aperture of the electron beam 3 passed through the spherical aberration corrector 14 is adjusted finely in this way, it is not necessary to modify the diameters of the holes formed in the aperture stop 13 after the spherical aberration is corrected by the spherical aberration corrector. That is, it is not necessary to greatly vary the pre-settings of the spherical aberration corrector 14. Accordingly, if the angular aperture is adjusted according to the settings of the spherical aberration corrector 14, transfer lens system 15, and objective lens 17, then the angular aperture is varied only within a highly limited range. Hence, it is unlikely that the operator misses the electron beam 3. It is possible to finely adjust the angular aperture of the beam 3 without modifying the diameters of the holes in the aperture stop 13. Also, the residual aberrations appearing on the specimen 18a can be suppressed. In consequence, the adjustment time can be shortened during high-magnification, high-resolution imaging.

The angular aperture of the electron beam 3 during aberration correction is about 30 to 50 μm, if converted into a hole diameter in the aperture stop, ahead of the spherical aberration corrector 14. The dimension is magnified approximately by a factor of M (e.g., if M=2, the aperture is about 80 μm) at the principal plane 15d of the second transfer lens 15b. Because the diameter of the beam 3 leaving the spherical aberration corrector 14 is increased by the transfer lens system 15 having the magnification of M(≥1), the amounts of variation of the diameters of the holes (i.e., the sizes of the holes) in the aperture stop that the fine adjustment of about 2 mrad must provide for are also increased. This relaxes the machining accuracy requirements for the holes in the aperture stop.

Where the transfer lens system 15 is made of a single axisymmetric lens, the angular aperture stop 16 is placed in the principal plane of this lens or near its opening portion.

Where existing apertures and machining accuracy requirements are taken into consideration, it is desired to set the magnification of the transfer lens system 15 to 1 or more, but the residual aberrations can be corrected using the angular aperture stop 16 without modifying the diameters of the holes in the aperture stop 13 even if the magnification is less than 1. Accordingly, the present invention is not restricted by the magnification of the transfer lens system 15.

Having thus described my invention with the detail and particularity required by the Patent Laws, what is desired protected by Letters Patent is set forth in the following claims.

The invention claimed is:

1. An electron microscope comprising:
   an electron gun for generating an electron beam;
   a spherical aberration corrector;
   an objective lens;
   a specimen holder on which a specimen may be placed;
   a transfer lens system mounted between the spherical aberration corrector and the objective lens said transfer lens system is comprised of a pair of axisymmetric lenses for transferring the electron beam such that the principal plane of the final stage of the spherical aberration corrector is conjugate with the front focal plane of the objective lens and produces a magnification of 1 or more;
   an aperture stop placed in a stage preceding the spherical aberration corrector movably relative to an optical axis; and an angular aperture stop mounted at or near a principal plane of the transfer lens movably relative to the optical axis to adjust an angular aperture of an electron beam wherein said angular aperture stop is mounted between a principal plane of a rear one of the axisymmetric lenses and a front focal plane of the objective lens.

2. The electron microscope of claim 1, wherein said angular aperture stop has plural holes having different diameters.

3. The electron microscope of claim 2, wherein the diameters of the holes of said angular aperture stop are 50 µm or more.

* * * * *